United States Patent
Zhang et al.

(10) Patent No.: US 7,791,117 B2
(45) Date of Patent: Sep. 7, 2010

(54) IMAGE SENSOR AND IMAGE SENSOR INTEGRATED TYPE ACTIVE MATRIX TYPE DISPLAY DEVICE

(75) Inventors: Hongyong Zhang, Kanagawa (JP); Masayuki Sakakura, Kanagawa (JP); Yurika Satou, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 367 days.

(21) Appl. No.: 11/838,600

(22) Filed: Aug. 14, 2007

(65) Prior Publication Data

US 2007/0290246 A1 Dec. 20, 2007

Related U.S. Application Data

(60) Continuation of application No. 11/418,279, filed on May 4, 2006, now Pat. No. 7,286,173, which is a division of application No. 09/156,461, filed on Sep. 18, 1998, now Pat. No. 7,046,282.

(30) Foreign Application Priority Data

Sep. 20, 1997 (JP) .................................. 9-273458

(51) Int. Cl.
    *H01L 31/062* (2006.01)
(52) U.S. Cl. ........................ 257/292; 257/59; 257/72; 257/290; 257/291; 257/293; 257/E27.13; 257/E27.132; 257/E27.133; 257/E27.141
(58) Field of Classification Search ............... 257/59, 257/72, 290–293, E27.13, E27.132, E27.133, 257/E27.141
See application file for complete search history.

(56) References Cited

U.S. PATENT DOCUMENTS

| 4,517,733 | A |   | 5/1985  | Hamano             |
|-----------|---|---|---------|--------------------|
| 4,545,672 | A |   | 10/1985 | Ozawa              |
| 4,760,389 | A |   | 7/1988  | Aoki et al.        |
| 4,940,313 | A |   | 7/1990  | Hamatani           |
| 4,948,231 | A |   | 8/1990  | Aoki et al.        |
| 5,075,244 | A | * | 12/1991 | Sakai et al. ............ 438/59 |
| 5,202,575 | A | * | 4/1993  | Sakai ............... 257/292 |
| 5,247,289 | A |   | 9/1993  | Matsueda           |
| 5,313,055 | A |   | 5/1994  | Shiratsuki et al.  |

(Continued)

FOREIGN PATENT DOCUMENTS

EP            0 605 246 A2       7/1994

(Continued)

*Primary Examiner*—Andy Huynh
(74) *Attorney, Agent, or Firm*—Husch Blackwell Sanders LLP

(57) ABSTRACT

To fabricate an active matrix type display device integrated with an image sensor at a low cost and without complicating process, an image sensor laminated with TFT and a light receiving unit is formed on a light receiving matrix, a display matrix is arranged with TFT and pixel electrodes on a matrix and formed with an electrode layer functioning as a black matrix, a lower electrode of the light receiving unit is formed by a starting film the same as that of the black matrix, a terminal for fixing potential of an upper electrode is formed by starting films the same as those of a signal line, the electrode layer or pixel electrodes and the terminals function also as shield electrodes for a side face of the light receiving unit since potential thereof is fixed.

8 Claims, 13 Drawing Sheets

U.S. PATENT DOCUMENTS

| | | | |
|---|---|---|---|
| 5,315,101 A | 5/1994 | Hughes et al. | |
| 5,324,980 A | 6/1994 | Kusunoki | |
| 5,349,174 A | 9/1994 | Van Berkel et al. | |
| 5,403,772 A | 4/1995 | Zhang et al. | |
| 5,424,244 A | 6/1995 | Zhang et al. | |
| 5,446,290 A | 8/1995 | Fujieda et al. | |
| 5,491,566 A | 2/1996 | Oh et al. | |
| 5,539,461 A | 7/1996 | Andoh et al. | |
| 5,563,427 A | 10/1996 | Yudasaka et al. | |
| 5,589,847 A | 12/1996 | Lewis | |
| 5,605,847 A | 2/1997 | Zhang | |
| 5,650,637 A | 7/1997 | Kodaira et al. | |
| 5,657,100 A | 8/1997 | Yamamoto et al. | |
| 5,684,318 A | 11/1997 | Ayres et al. | |
| 5,717,224 A | 2/1998 | Zhang | |
| 5,798,744 A | 8/1998 | Tanaka et al. | |
| 5,812,109 A | 9/1998 | Kaifu et al. | |
| 5,824,574 A | 10/1998 | Yamazaki et al. | |
| 5,831,258 A | 11/1998 | Street | |
| 5,831,699 A | 11/1998 | Wright et al. | |
| 5,873,003 A | 2/1999 | Inoue et al. | |
| 5,917,225 A | 6/1999 | Yamazaki et al. | |
| 5,926,238 A | 7/1999 | Inoue et al. | |
| 5,952,992 A | 9/1999 | Helms | |
| 5,962,872 A | 10/1999 | Zhang et al. | |
| 5,966,193 A | 10/1999 | Zhang et al. | |
| 5,991,467 A | 11/1999 | Kamiko | |
| 6,005,648 A | 12/1999 | Zhang et al. | |
| 6,028,581 A | 2/2000 | Umeya | |
| 6,031,655 A | 2/2000 | Yagyu | |
| 6,087,648 A | 7/2000 | Zhang et al. | |
| 6,091,382 A | 7/2000 | Shioya et al. | |
| 6,097,454 A | 8/2000 | Zhang et al. | |
| 6,166,396 A | 12/2000 | Yamazaki | |
| 6,233,027 B1 | 5/2001 | Unno et al. | |
| 6,236,063 B1 | 5/2001 | Yamazaki et al. | |
| 6,243,155 B1 | 6/2001 | Zhang et al. | |
| 6,274,861 B1 | 8/2001 | Zhang et al. | |
| 6,277,679 B1 | 8/2001 | Ohtani | |
| 6,288,388 B1 | 9/2001 | Zhang et al. | |
| 6,295,390 B1 | 9/2001 | Kobayashi et al. | |
| 6,388,652 B1 | 5/2002 | Yamazaki et al. | |
| 6,399,933 B2 | 6/2002 | Zhang et al. | |
| 6,462,806 B2 | 10/2002 | Zhang et al. | |
| 6,495,857 B2 | 12/2002 | Yamazaki | |
| 6,496,240 B1 | 12/2002 | Zhang et al. | |
| 6,583,439 B2 | 6/2003 | Yamazaki et al. | |
| 6,680,764 B2 | 1/2004 | Zhang et al. | |
| 6,784,411 B2 | 8/2004 | Zhang et al. | |
| 2003/0025136 A1 | 2/2003 | Zhang et al. | |
| 2003/0201450 A1 | 10/2003 | Yamazaki et al. | |
| 2004/0217357 A1 | 11/2004 | Zhang et al. | |

FOREIGN PATENT DOCUMENTS

| | | |
|---|---|---|
| JP | 57-22251 | 2/1982 |
| JP | 62-86854 | 4/1987 |
| JP | 62-86855 | 4/1987 |
| JP | 1-220862 | 9/1989 |
| JP | 2-262369 | 10/1990 |
| JP | 2-265274 | 10/1990 |
| JP | 2-280374 | 11/1990 |
| JP | 6-18845 | 1/1994 |
| JP | 6-22250 | 1/1994 |
| JP | 6-334910 | 12/1994 |
| JP | 7-64114 | 3/1995 |
| JP | 8-79444 | 3/1996 |
| JP | 9-45927 | 2/1997 |
| JP | 10-31235 | 2/1998 |

* cited by examiner

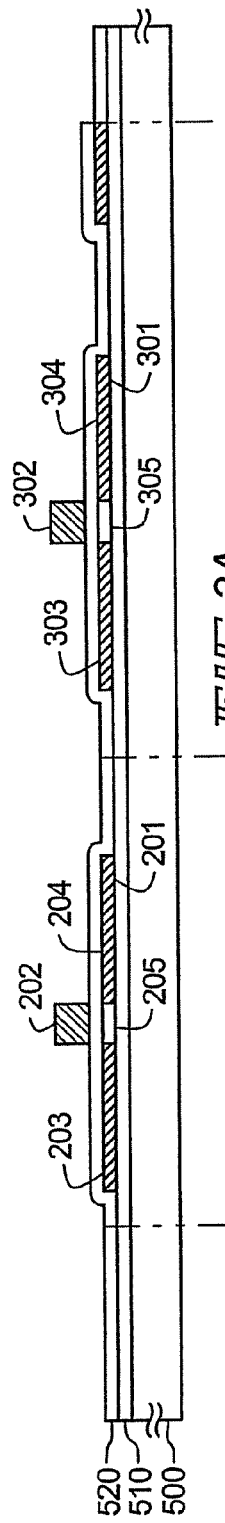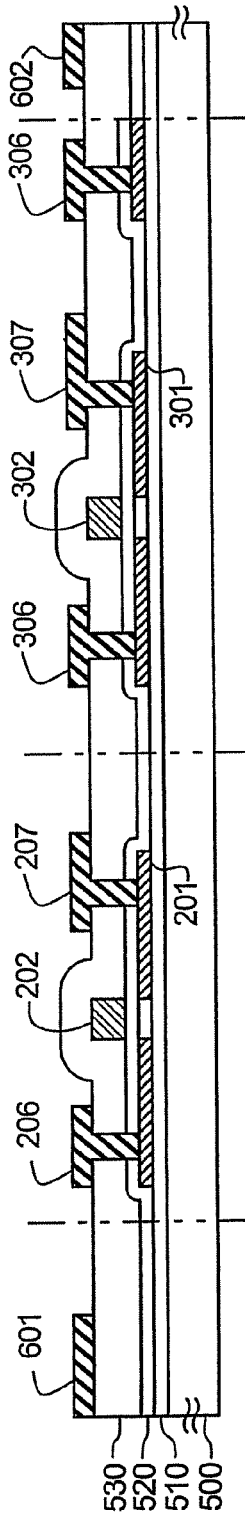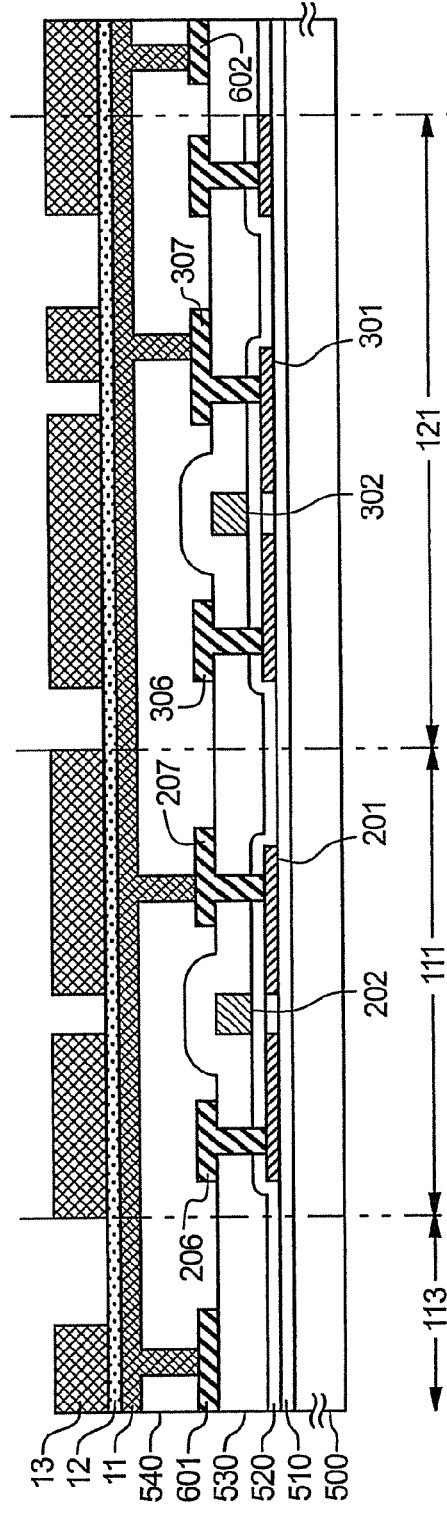
FIG. 3A
FIG. 3B
FIG. 3C

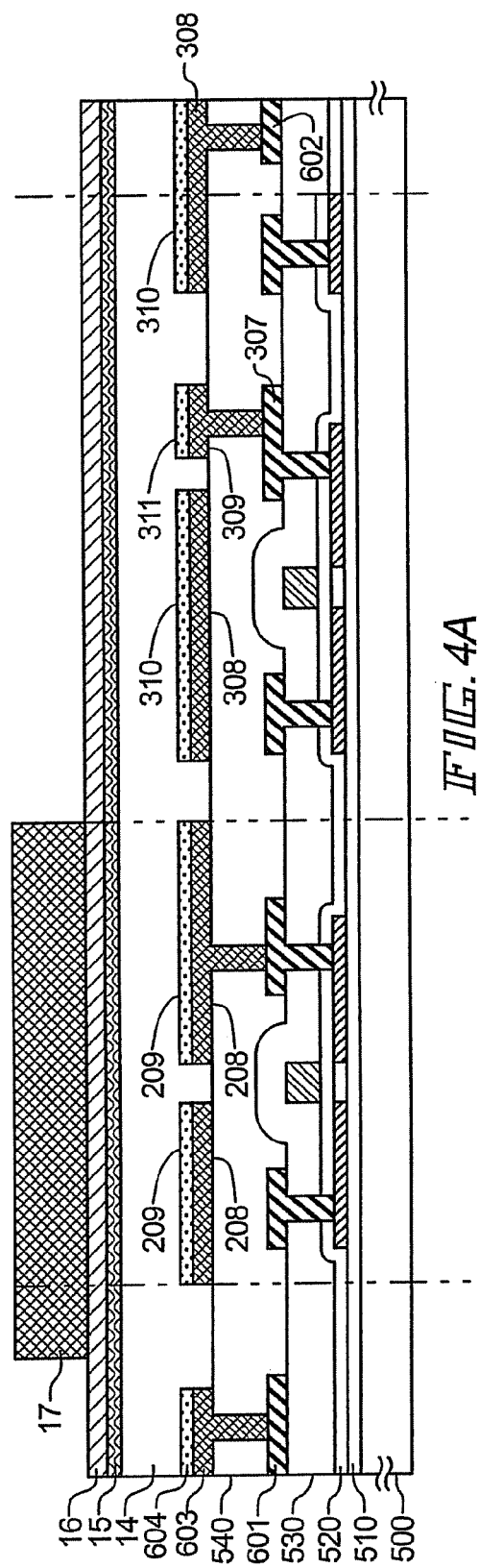
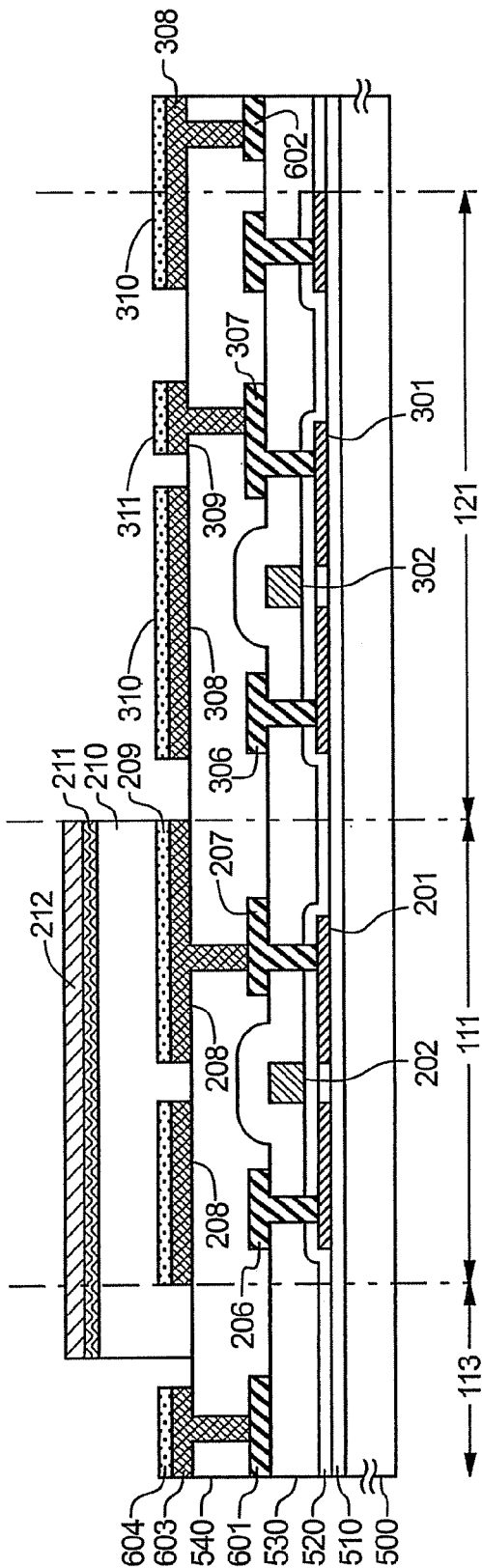
FIG. 4A
FIG. 4B

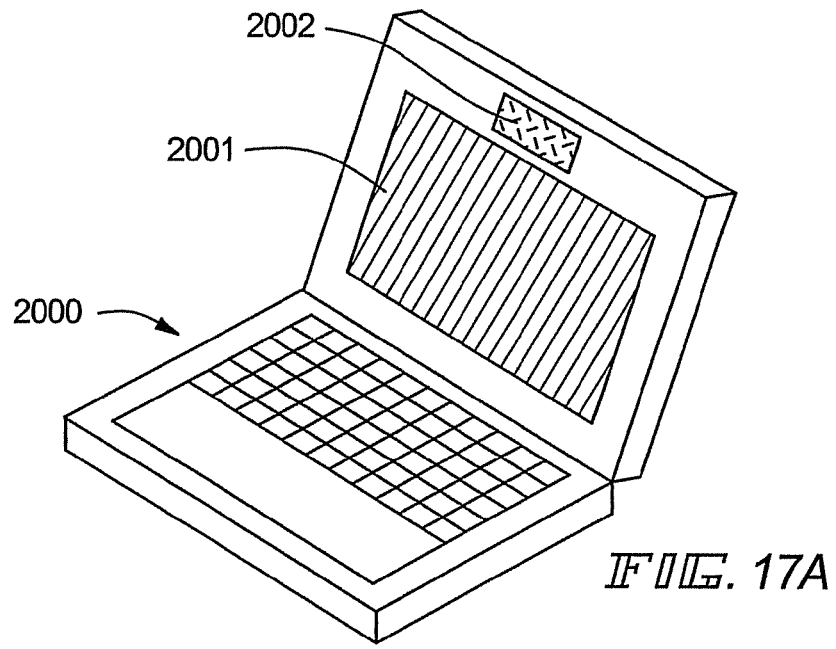
FIG. 17A
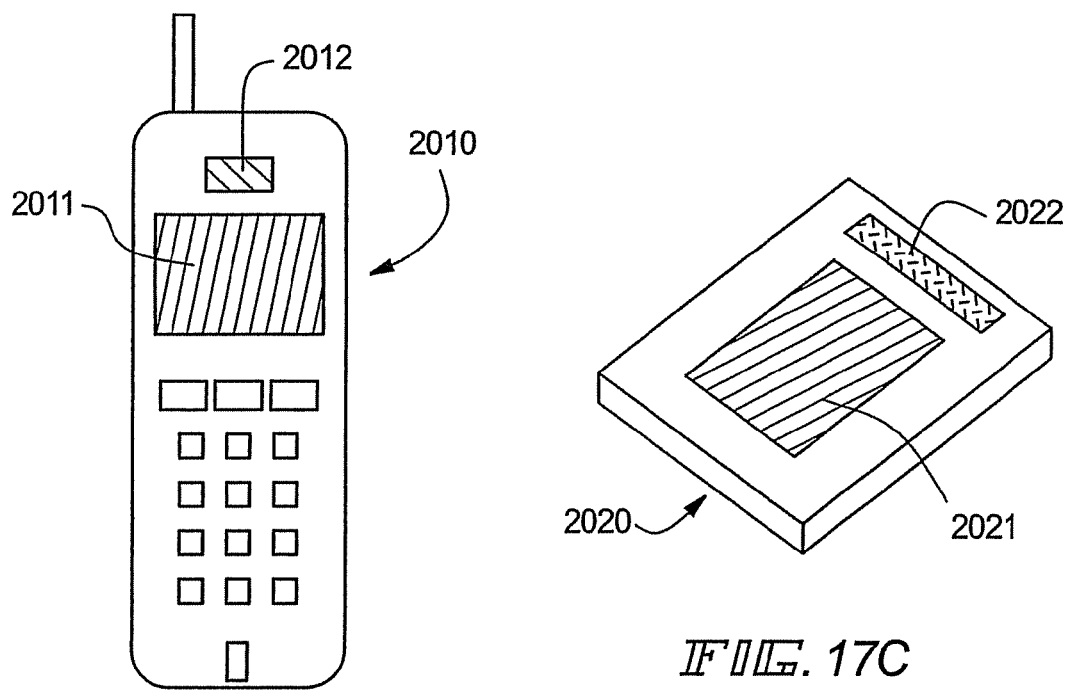
FIG. 17B
FIG. 17C

IMAGE SENSOR AND IMAGE SENSOR INTEGRATED TYPE ACTIVE MATRIX TYPE DISPLAY DEVICE

This application is a continuation of copending U.S. application Ser. No. 11/418,279 filed on May 4, 2006 which is a divisional of U.S. application Ser. No. 09/156,461 filed on Sep. 18, 1998 (now U.S. Pat. No. 7,046,282 issued May 16, 2006).

BACKGROUND OF THE INVENTION

1. Field of the Invention

The present invention relates to an image sensor having a light receiving unit for converting light into electric charge and a scanning circuit for scanning light receiving pixels and reading electric charge generated at the light receiving unit as signal, particularly to an image sensor of a laminated layer type in which a light receiving unit is laminated on a scanning circuit.

Further, the present invention relates to an active matrix type display device integrated with an image sensor and a display matrix of a laminated layer type.

2. Description of Related Art

An optical sensor is widely used as a sensor for converting light into electric signal. For example, an optical sensor is widely used as an image sensor for a facsimile, a copier, a video camera, a digital still camera or the like.

To meet request of multimedia, high density formation of pixels of an image sensor has been rapidly progressed. For example, in respect of standard of pixels of a digital still camera, the high speed formation is promoted from VGA (Video Graphics Array) (640×480=310,000 pixels) to SVGA (Super VGA) or XGA (Extended Video Graphics Array), further to SXGA (Super XGA) (1280×1024=1,310,000 pixels).

Further, to meet request of small-sized formation and low cost formation of a multimedia tool such as a digital still camera or the like, an optical system has been downsized year by year from ⅔ inch to ½ inch, ⅓ inch and ¼ inch.

In this way, an image sensor which is a small light receiving cell having excellent conversion efficiency has been requested to realize high density formation of pixels and small-sized formation of an optical system. To satisfy the request, for example, to promote an aperture ratio, there has been proposed an image sensor of a laminated layer type in which a scanning circuit for reading electric charge generated at a light receiving unit as signal and the light receiving unit (photo diode unit) are laminated.

In recent years, a technology of fabricating TFT (Thin Film Transistor) using polycrystal silicon which is referred to as polysilicon TFT has been studied intensively. As a result, it becomes possible to fabricate a drive circuit of a shift register circuit or the like by a polysilicon TFT and there has been reduced into practice a liquid crystal panel of an active matrix type in which a display matrix and a peripheral drive circuit for driving the display matrix are integrated on the same substrate. Thereby, low cost formation, small-sized formation and light-weighted formation of a liquid crystal panel have been achieved and therefore, the liquid crystal panel has been used in display units of various information devices and portable devices of a personal computer, a portable telephone, a video camera, a digital camera and so on.

There has been currently reduced into practice a small-sized portable information processing terminal device which is more excellent than a notebook type personal computer in portability, inexpensive and of a pocket size and an active matrix type liquid crystal panel is used for a display unit thereof. According to such an information processing terminal device, data can be inputted from the display unit by a touch pen system, in order to input data/graphic information on paper or image information, a peripheral device of a scanner, a digital camera or the like is needed. Therefore, the portability of the information processing terminal device is deteriorated. Further, economic burden is imposed on a user to purchase the peripheral device.

Further, an active matrix type display device is also used in a display unit for a TV conference system, a TV telephone, a terminal for internet or the like. According to the system or the terminal, a camera for taking picture of a dialogue partner or a user is provided and a display unit and a camera unit are individually fabricated into modules.

SUMMARY OF THE INVENTION

It is a problem of the present invention to achieve further promotion of an aperture rate in an image sensor of a laminated layer type and particularly, the present invention relates to a structure of a lead-out terminal for fixing an upper electrode on a light incident side of a light receiving unit to constant potential.

It is an object of the present invention to resolve the problems mentioned above and to provide an active matrix type display device which is made intelligent to be provided with both of picture taking function and display function by installing an image sensor on a substrate formed with a display matrix and peripheral circuits.

In order to resolve the above-described problem, according to an aspect of the present invention, there is provided an image sensor laminated with a light receiving unit for converting light into electric charge at a light receiving pixel region in which a plurality of light receiving pixels are arranged and a signal reading unit for reading electric charge generated at the light receiving unit as a signal, the light receiving unit comprising:

a plurality of lower electrodes separated from each other at respectives of the light receiving pixels, a photoelectric conversion layer, and an upper electrode common to the light receiving pixels, the image sensor further comprising:

a lead-out terminal formed at a layer different from a layer of the upper electrode;

the upper electrode is connected to the lead-out terminal on a light incident side at outside of the light receiving pixel region.

Further, according to another aspect of the present invention, there is provided an image sensor integrated type active matrix type display device which is an active matrix type display device comprising on a same substrate:

a display matrix having a plurality of pixel electrodes in which a plurality of select lines and a plurality of signal lines are arranged in a shape of a lattice, and an image sensor laminated with a light receiving unit for converting light into electric charge and a signal reading unit for reading the electric charge generated at the light receiving unit as a signal in a light receiving pixel region in which a plurality of light receiving pixels are arranged;

wherein the light receiving unit includes a plurality of lower electrodes separated from each other at respectives of the light receiving pixels, a photoelectric conversion layer and an upper electrode common to the light receiving pixels, the upper electrode is connected to a lead-out terminal on a light incident side, and the lead-out terminal is formed at a layer different from a layer of the upper electrode.

Further, in the image sensor integrated type active matrix type display device mentioned above, an electrode layer covering at least the signal lines and the select lines is formed and the lower electrode of the light receiving unit is formed by a starting film the same as a starting film of the electrode layer.

Further, in the image sensor integrated type active matrix type display device, the pixel matrix comprises active devices formed on the substrate and connected to the signal lines and the select lines, a first insulating film covering the active devices, an electrode layer formed on the first insulating film and covering at least the signal lines and the select lines, a second insulating film formed on the electrode layer, and pixel electrodes formed on the second insulating film and connected to the active devices, wherein the image sensor comprises the signal reading unit formed on the substrate, the first insulating film covering the signal reading unit, a plurality of the lower electrodes formed on the first insulating film, comprising a starting film the same as a starting film of the electrode layer and separated from each other at respectives of the light receiving pixels, a photoelectric conversion layer formed on the lower electrodes, an upper electrode formed on the photoelectric conversion layer and common to the light receiving pixels, the second insulating film covering the upper electrode, and a lead-out terminal formed on the second insulating film and connected to the upper electrode, and wherein the upper electrode is formed by a starting film the same as a starting film of the pixel electrodes.

BRIEF DESCRIPTION OF THE DRAWINGS

FIGS. 3A, 3B and 3C are sectional views for explaining fabrication steps of the liquid crystal panel according to Embodiment 1;

FIGS. 4A and 4B are sectional views for explaining fabrication steps of the liquid crystal panel according to Embodiment 1;

FIGS. 17A, 17B and 17C are schematic outlook views of products to which liquid crystal panels of Embodiment 6 are applied.

DETAILED DESCRIPTION OF THE PREFERRED EMBODIMENTS

Figure 1:
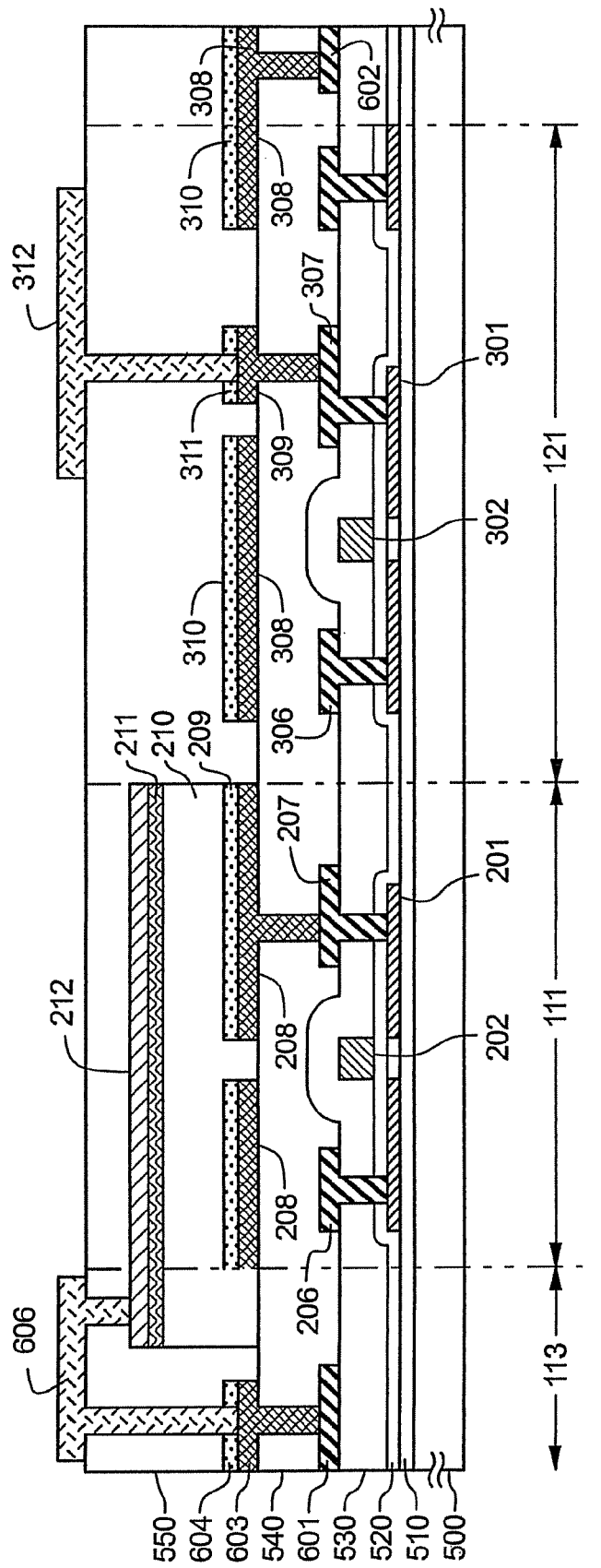
FIG. 1 is a sectional view of a liquid crystal panel according to Embodiment 1.

An explanation will be given of a display device integrally provided with an image sensor on an element substrate in an active matrix type display device of a peripheral circuit integrated type according to an embodiment in reference to FIG. 1.

A light receiving matrix 111 and a display matrix 121 are formed on a substrate 500. Signal lines 307 and select lines 302 are arranged in a lattice shape at the display matrix 121 and an active element comprising TFT connected with the signal line 307 and the select line 302 is arranged in the lattice for each display pixel.

The display matrix 121 is arranged with a first insulating layer 540 covering TFT and an electrode layer 308 formed on the first insulating layer 540 and covering at least the select lines 302 and the signal lines 307. Although in FIG. 1, the electrode layer 308 is illustrated to be divided to disconnect, the electrode layer 308 is integrally arranged in a lattice shape.

A second insulating film 550 is formed on the electrode layer 308 and pixel electrodes 312 are formed on the second insulating film 550. The pixel electrode 312 is connected to TFT of the display matrix via a contact hole provided to the first and the second insulating films 540 and 550.

The electrode layer 308 prevents light from being incident on the active element arranged in the display matrix 121, makes light from an effective display region to contribute to display and prevents display characteristic from deteriorating. Further, by fixing potential of the electrode layer 308, a variation of potential at the select line 302 or the signal line 306 can be prevented from being fed back to potential of the pixel electrode 312.

Meanwhile, the light receiving matrix 111 is arranged with a scanning circuit for scanning light receiving pixels by using TFTs as switching elements as a signal reading unit. The signal reading unit is covered with the first insulating film 540 similar to the active element in the display unit. A light receiving unit is formed on the first insulating layer 540. Electric charge generated at the light receiving unit or a change in potential of the light receiving unit is read as a signal by a second insulating gate type semiconductor device.

The light receiving unit is constituted by a plurality of lower electrodes 208 which are separated from each other for respective light receiving pixels, a photoelectric conversion layer 210 formed over the lower electrodes 208 and an upper electrode 212 formed over the photoelectric conversion layer 210 and common to the light receiving pixel. The lower electrode 208 is formed by a starting film the same as that of the electrode layer 308. The light receiving unit is passivated by the second insulating film 550.

The photoelectric conversion film 210 may use a silicon-base semiconductor of amorphous silicon, amorphous silicon germanium or the like which is intrinsic or substantially intrinsic. A silicon-base semiconductor film having pin junctions may be used. Further, when the light receiving unit is rendered a photoconductor, a ZnSe/ZnCdTe film or a laminated film of Se/Te/As which is generally used in a solid image tube may be used.

Further, in FIG. 1, a film 209 and a film 211 are n-type and p-type amorphous silicon films for coupling the photoelectric conversion layer 210 comprising amorphous silicon with the lower electrode 208 and the upper electrode 212 in ohmic coupling. Further, in place of the n-type amorphous silicon film 209, a film functioning as a barrier film of the amorphous silicon film 210 may be provided. In this case, a silicon oxide film, a silicon nitride film, a silicon carbide film or the like added with an n-type impurity of phosphorus or the like can be used.

In order to fix potential of the upper electrode 212, at outside of the light receiving matrix 111, the upper electrode 212 of the light receiving unit is connected to a lead-out wiring 606 comprising a starting film the same as that of the pixel electrode 312 via a contact hole provided in the second insulating film 550.

Further, the lead-out wiring 606 is connected to a lead-out terminal 603 comprising a starting film the same as that of the electrode layer 308 and the lead-out terminal 603 is connected to a lead-out terminal 601 comprising a starting film the same as that of the signal line 307. The lead-out terminal 601 is connected an outer terminal constituting a connecting portion for connecting with a wiring outside of the substrate directly or via other wiring. By fixing the lead-out terminal 601 at constant voltage, the potential of the upper electrode 212 can be fixed constant.

In the laminated layer type image sensor, all of opening portions are covered by the upper electrode 212, the potential is fixed constant and accordingly, noise invading from a light incident side can be shielded by the upper electrode 212. Further, according to the embodiment, the side face of the light receiving unit is surrounded by the terminals 601, 603 and 606 and potential of the terminals is fixed constant and accordingly, noise from the side face of the light receiving unit can also be prevented from invading. Therefore, the S/N (Signal/Noise) ratio can be promoted and an image sensor with high function and high reliability can be provided.

The embodiment is characterized in that the display matrix 121 and the light receiving matrix 111 are formed on the same substrate and accordingly, the film forming process and the patterning process are made common in the respective matrices 111 and 121. The insulating films 540 and 550 are commonly provided to the respective matrices 111 and 121.

Further, the electrode layer 308 and the lower electrode 208 and the pixel electrode 312 and the lead-out terminal 606 are formed by the same film forming processes and patterning processes. Thereby, there can be provided an active matrix type display device of an image sensor integrated type by minimizing additional steps by which the fabrication cost can be restrained inexpensively.

Further, the embodiment is characterized in that in order to fix the potential of the upper electrode 212 the lead-out terminal 606 for connecting the upper electrode 212 to an external terminal, is not integrally formed with the upper electrode 212. The characteristic resides in that the lead-out terminal 606 is formed at a layer different from that of the upper electrode 212 and is connected on the light incident side of the upper electrode 212.

When the lead-out terminal 606 is formed integrally with the upper electrode 212, patterns of the upper electrode 212 and the photoelectric conversion layer 210 are different from each other and patterning steps of the upper electrode 212 are different from those of the photoelectric conversion layer 210. Therefore, the aperture ratio may be deteriorated by a shift of masks in patterning of the upper electrode 212.

On the other hand, by constituting the upper electrode 212 and the lead-out terminal by conductive films arranged at layers different from each other, there is achieved an effect in which patternings of the upper electrode 212 and the photoelectric conversion layer 210 can continuously be carried out by using a single one of a resist mask and the aperture ratio is prevented from deteriorating by the shift of masks. Further, when the photoelectric conversion layer 210 is patterned, damage caused in the patterning process of the photoelectric conversion layer 210 can be restrained since the upper electrode 212 is present on the photoelectric conversion layer 210.

According to the embodiment, the upper electrode 212 and the lead-out terminal 606 are constituted by conductive films arranged at layers different from each other. In order to pattern the upper electrode 212 and the photoelectric conversion layer 210 by the same process, it is also important that the conductive layer is formed above the upper electrode 212 and the lead-out terminal 606 is connected to the light incident side of the upper electrode 212. Further, by forming the lead-out terminal 606 by a process the same as that of the pixel electrode 312, consistency with fabrication process of an active type display device is established.

EMBODIMENTS

A detailed explanation will be given of embodiments of the present invention in reference to FIG. 1 through FIG. 17.

Embodiment 1

The embodiment relates to a transmission type liquid crystal display device in which an image sensor and a display matrix are provided on the same substrate.

Figure 2:
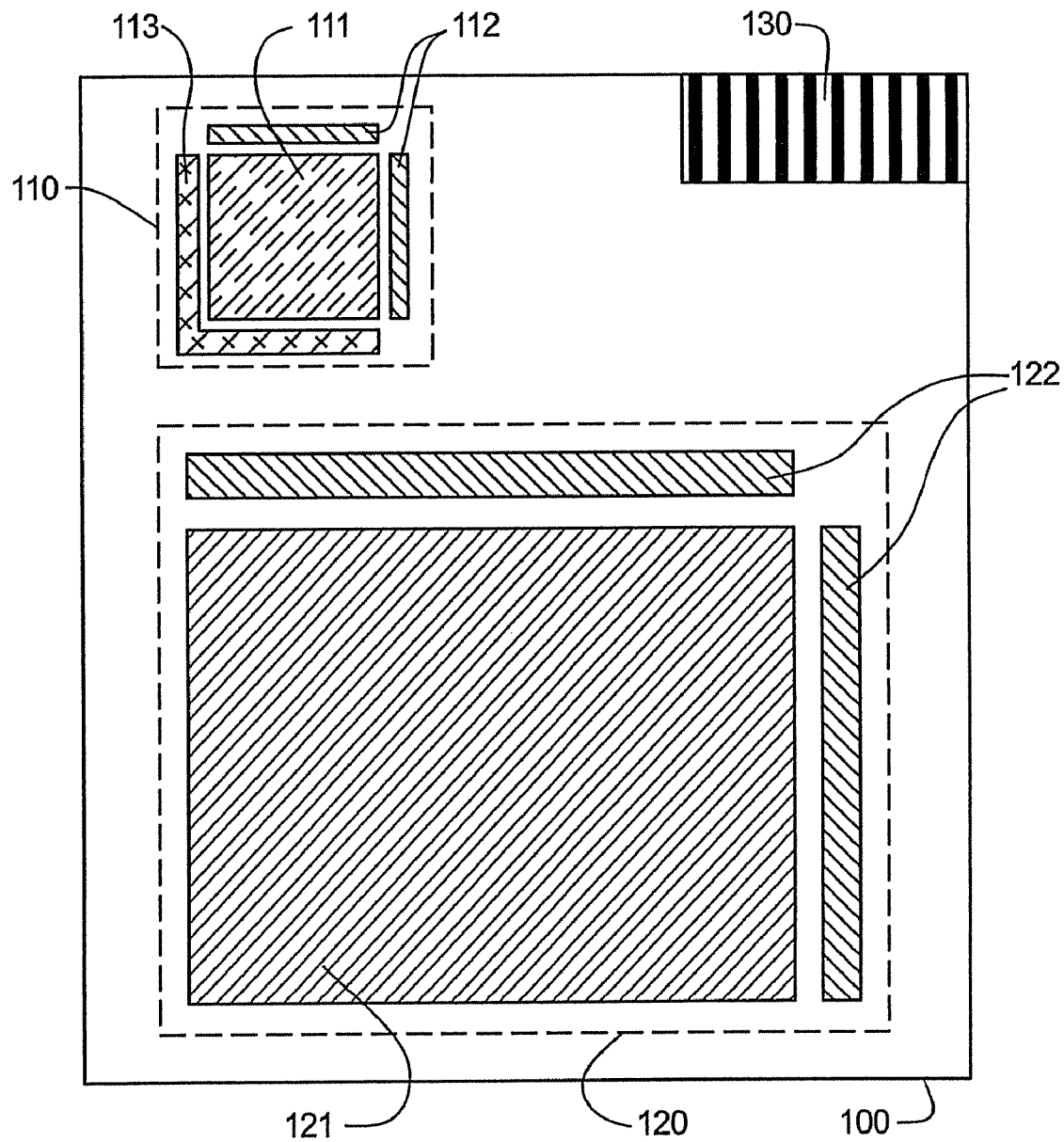
FIG. 2 is a front view of the liquid crystal panel according to Embodiment 1.

FIG. 2 is a front view of a liquid crystal display device according to the embodiment. As shown by FIG. 2, both of a light receiving region 110 and a display region 120 are provided on a substrate 100. The light receiving region 110 is formed with the light receiving matrix 111 in which a plurality of light receiving pixels are arranged in a matrix shape, peripheral circuits 112 connected to the light receiving matrix 111 and a terminal unit 113 in which lead-out terminals are arranged to surround portions of the periphery of the light receiving matrix 111 to which the peripheral circuits are not connected. The light receiving matrix 111 is provided with a structure in which a light receiving unit (photodiode) and semiconductor devices for reading electric charge generated at the light receiving unit as signals, are laminated.

Meanwhile, the display region 120 is installed with the display matrix 121 in which pixel electrodes and active elements which are connected to the pixel electrodes are arranged and peripheral drive circuits 122 for driving the active devices arranged at the display matrix 121. Further, an outside lead-out terminal unit 130 constituting a connecting portion for connecting with a wiring of a power source line or the like outside of the substrate, is provided on the substrate 100.

According to the embodiment, insulating gate type semiconductor devices of the light receiving matrix 111, active elements of the display matrix 121 and semiconductor devices arranged at the peripheral drive circuits 112 and 122, are simultaneously fabricated by TFTs (Thin Film Transistors) by using CMOS (Complementary Metal Oxide Semiconductor) technology. An explanation will be given of a method of fabricating a liquid crystal panel according to the embodiment as follows.

FIGS. 3A, 3B and 3C and FIGS. 4A and 4B show sectional views of the light receiving matrix 111, the lead-out terminal unit 113 and the display matrix 121. Further, FIGS. 5, 6, 7A, 7B, 8A and 8B show front views indicating a fabrication procedure of the light receiving region 110, FIGS. 9, 10, 11 and 12 show front views indicating a fabrication step of the display matrix 121 and FIGS. 13 and 14 show front views indicating a fabrication step of CMOS-TFTs arranged at the peripheral circuits 112 and 122.

First, as shown by FIG. 3A, an underlying film 510 for preventing diffusion of impurities from a substrate is formed on the entire face of a glass substrate 500. A silicon oxide film is formed by a thickness of 200 nm as the underlying film 510 by a plasma CVD (Chemical Vapor Deposition) process.

Figure 5:
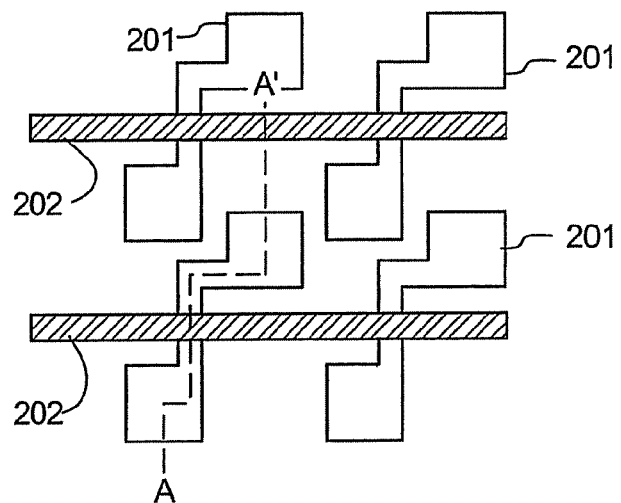
FIG. 5 is a front view for explaining fabrication steps of light receiving matrix according to Embodiment 1.
Figure 9:
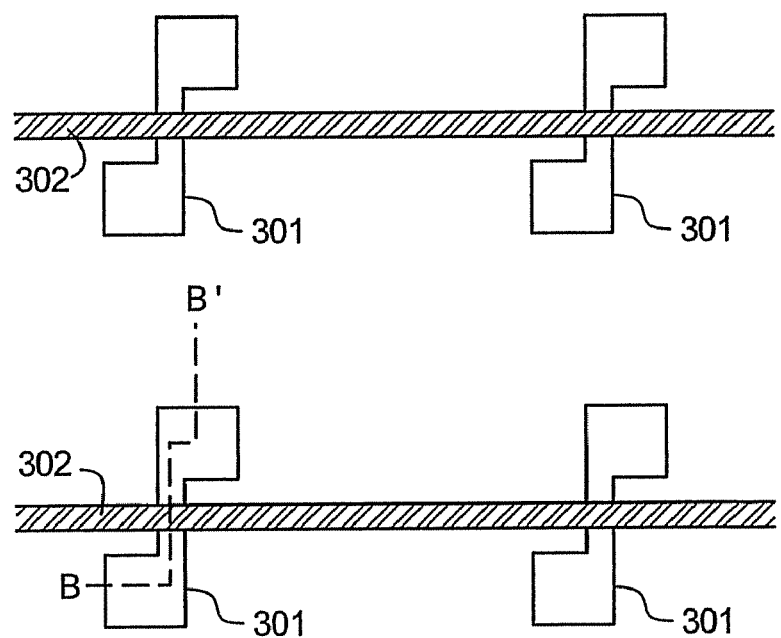
FIG. 9 is a front view for explaining fabrication steps of a display matrix according to Embodiment 1.
Figure 13:
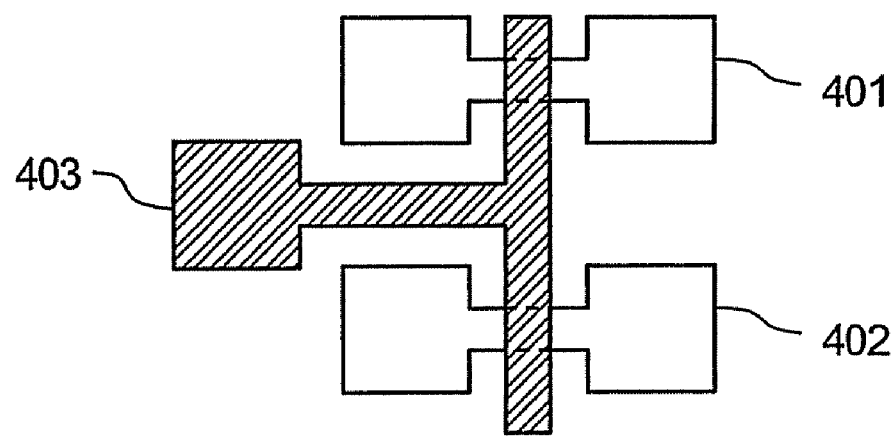
FIG. 13 is a front view for explaining fabrication steps of a drive circuit according to Embodiment 1.
Figure 14:
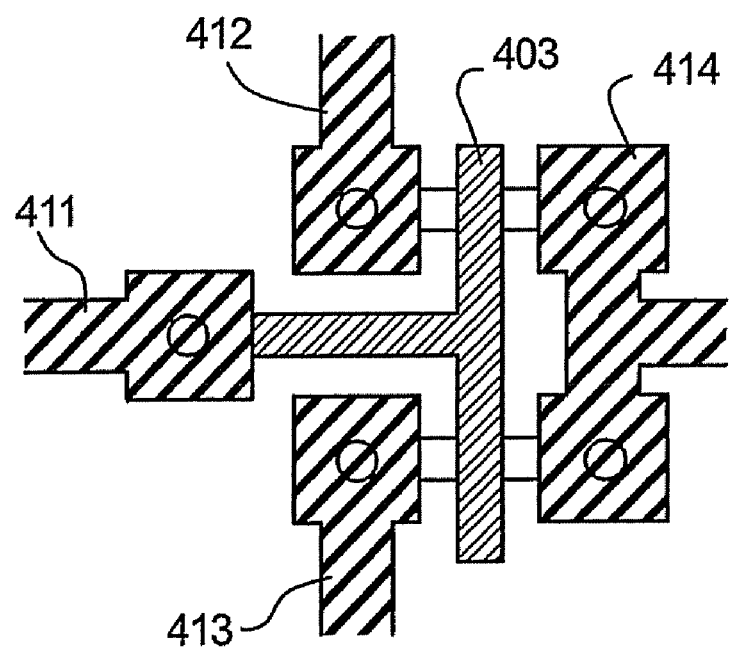
FIG. 14 is a front view for explaining fabrication steps of the drive circuit according to Embodiment 1.
Figure 15:
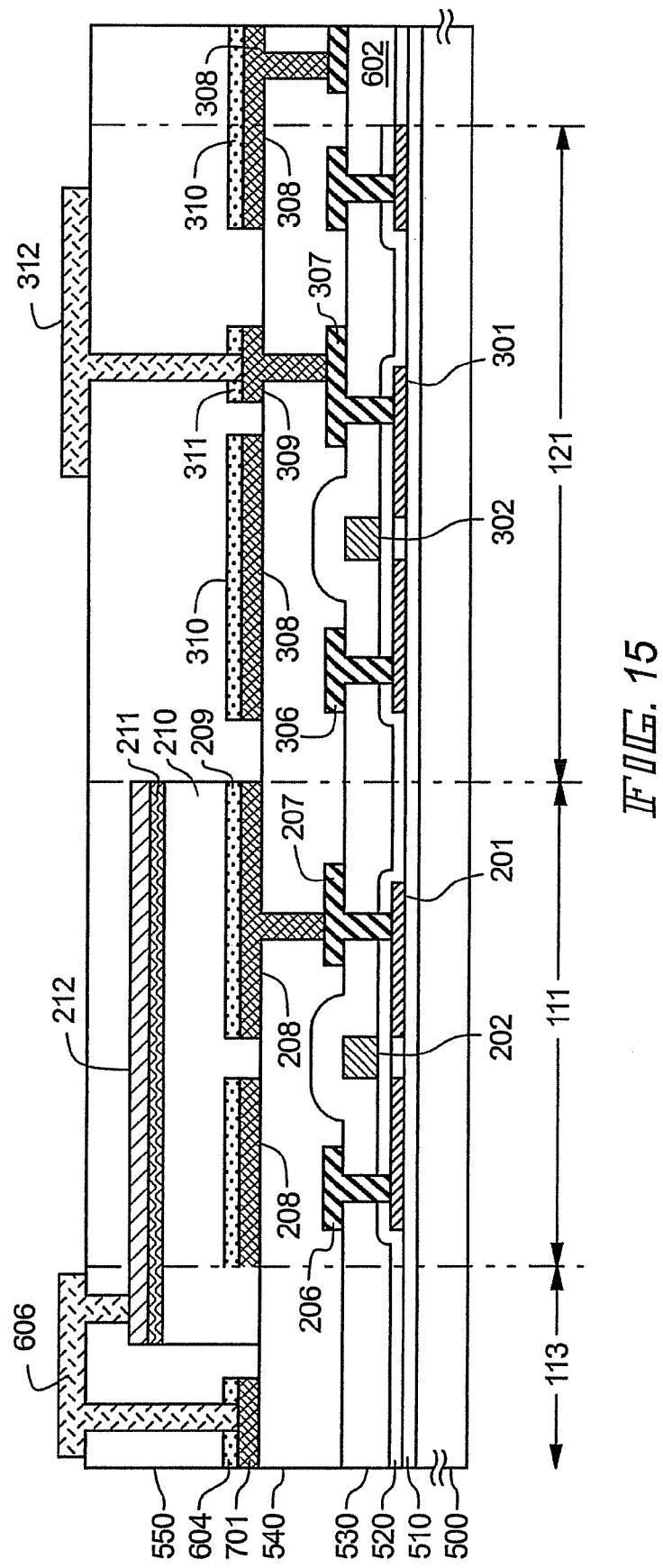
FIG. 15 is a sectional view of a liquid crystal panel according to Embodiment 2.
Figure 16:
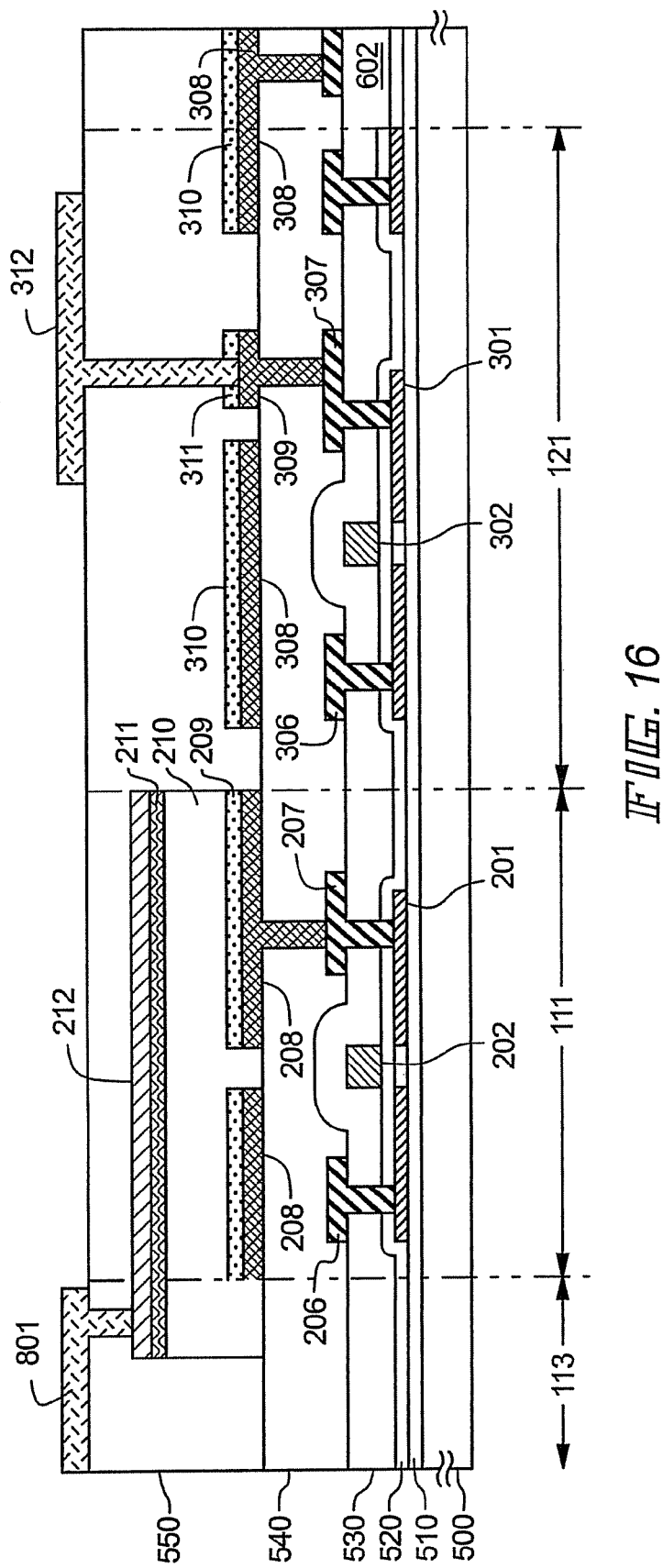
FIG. 16 is a sectional view of a liquid crystal panel according to Embodiment 3.

Front views of the light receiving matrix 111 and the display matrix 121 of FIG. 3A correspond to FIG. 5 and FIG. 9, respectively and the front view of the CMOS-TFTs corresponds to FIG. 13. A sectional view taken along a line A-A' in FIG. 5 and a line B-B' in FIG. 9 corresponds to FIG. 3A.

According to the embodiment, to fabricate a transmission type liquid crystal panel, the substrate 500 may be a substrate for transmitting visible light and a quartz substrate or the like can be used in place of the glass substrate 500. Further, according to the embodiment, TFTs are fabricated by a polycrystal silicon film and accordingly, a substrate capable of withstanding a process of forming the polycrystal silicon film is selected for the substrate 500. Mobility of the polycrystal silicon film is very large and is about 10 through 200 $cm^2$/Vsec and high speed response can be carried out by constituting a channel forming region of TFT by the polycrystal silicon which is particularly effective in TFTs of the light receiving matrix 111 and CMOS-TFTs of the peripheral drive circuits 112 and 122.

Next, an amorphous silicon film is formed by a thickness of 55 nm by a plasma CVD process and excimer laser beam is irradiated so as to crystallize. As a method of crystallizing an amorphous silicon film, a thermal crystallizing process referred to as SPC, RTA process for irradiating infrared ray, a process using both of the thermal crystallization and laser annealing and the like can be used.

Next, a crystallized silicon film is patterned in a land-like shape and activation layers of TFTs 201 and 301 are formed. FIG. 13 shows the activation layers 401 and 402. Next, a gate insulating film 520 covering the activation layers 201, 301, 401 and 402 is formed. The gate insulating film 520 is formed by a thickness of 120 nm by a plasma CVD process by using raw natural gases of silane ($SiH_4$) and $N_2O$.

Next, a conductive film of a metal of Al, Cr, Mo or the like, a conductive polysilicon film or the like is formed and patterned by which select lines 202 and 302 and a gate electrode 403 are formed. Impurities providing one conductivity are doped to the activation layers 201, 301, 401 and 402 by using publicly-known CMOS technology with the wirings and the electrode 202, 302 and 403 as masks by which source and drain regions are formed.

By doping phosphorus to the activation layers 201, 301 and 401, N-type source regions 204 and 303, drain regions 203 and 304 and channel forming regions 205 and 305 are self-adjustingly formed. Illustration of source/drain regions of the activation layer 401 is omitted. The activation layers 201, 301 and 401 are covered with a resist mask and boron is doped only to the activation layer 402 by which a P-type source region and a drain region and a channel forming region are self-adjustingly formed. After doping, doped impurities are activated.

Further, according to the embodiment, the activation layers 201, 301 and 401 are of polycrystal silicon and accordingly, it is preferable to optimize threshold values by adding P-type impurities of boron or the like at least to regions for constituting the channel forming regions 205 and 305 of the N-channel type TFT before forming the wirings and the electrodes 202, 302 and 403.

Next, as shown by FIG. 3B, a first interlayer insulating film 530 covering the entire face of the substrate 500 is formed. Contact holes reaching the source regions and the drain regions of respective TFTs and a contact hole reaching the gate electrode 403 of CMOS-TFT are respectively formed in the interlayer insulating film 530. Thereafter, a laminated layer film comprising a titanium film, an aluminum film and a titanium film is formed and patterned by which a signal line 206, a source electrode 207 of the light receiving matrix 111 and a signal line 306 and the drain electrode 307 of the display matrix 121 are respectively formed.

Figure 6:
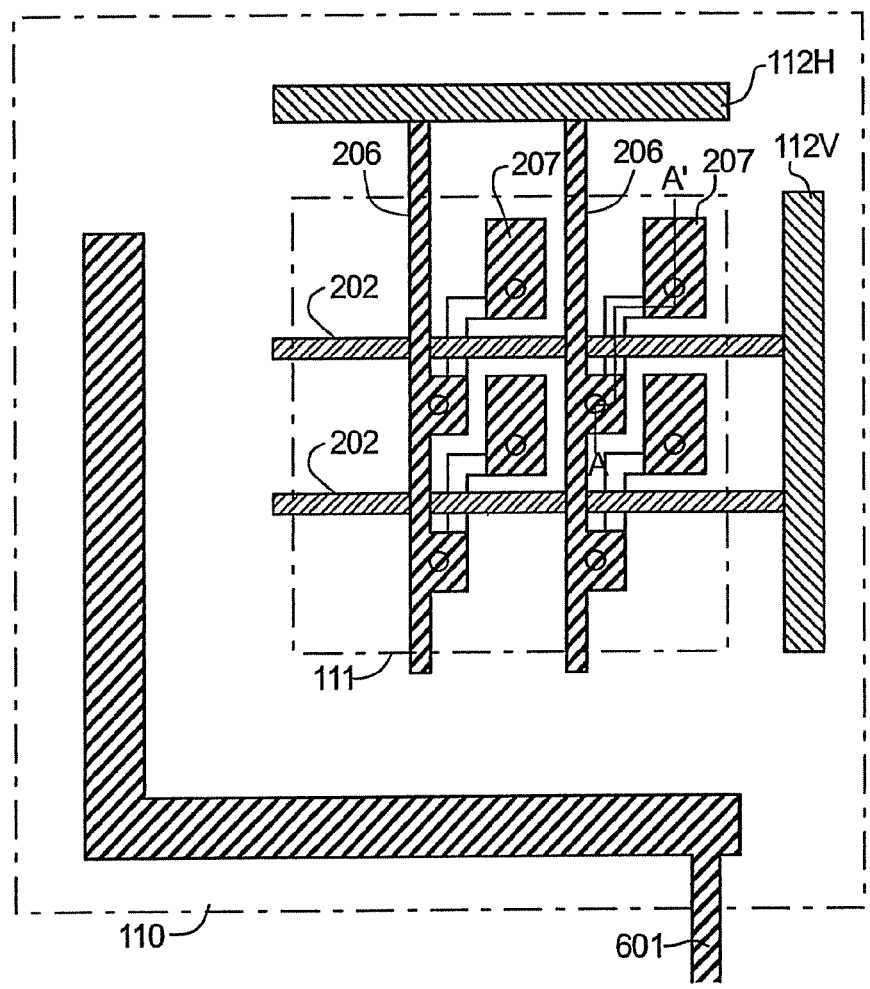
FIG. 6 is a front view for explaining fabrication steps of the light receiving matrix according to Embodiment 1.
Figure 10:
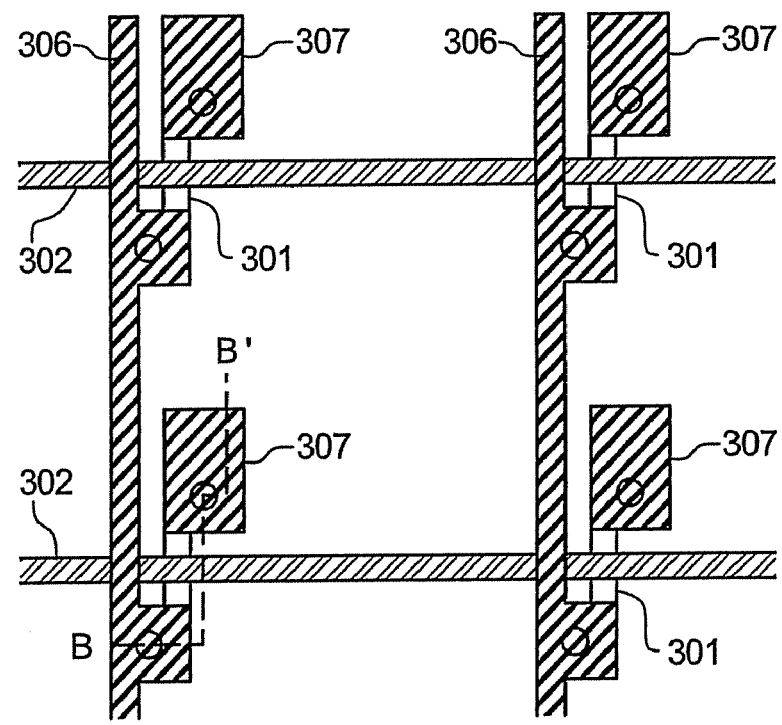
FIG. 10 is a front view for explaining fabrication steps of the display matrix according to Embodiment 1.

Front views of the light receiving matrix 111 and the display matrix 121 under the state correspond to FIG. 6 and FIG. 10, respectively. A sectional view taken along a line A-A' and a line B-B' in FIG. 6 and FIG. 10 corresponds to FIG. 3A.

Further, as shown by FIG. 14, CMOS-TFT is formed with an input wiring 411 connected to the gate electrode 403, a wiring 412 connected to a source region of an n-channel type TFT, a wiring 413 connected to a drain region of a p-channel type TFT and a wiring 414 connected to a drain region of the n-channel type TFT and a source region of the p-channel type TFT.

As shown by FIG. 6, in the light receiving matrix 111, the select line 202 is connected to a peripheral circuit 112V and is inputted with a select signal for designating a light receiving pixel for reading signal electric charge generated at the light receiving unit from the peripheral circuit 112V. Further, the signal line 206 is connected to a peripheral circuit 112H and read signal electric charge is outputted to the peripheral circuit 112H via the signal line 206 and is outputted to outside as image signal from the peripheral circuit 112H.

Further, the lead-out terminal unit 113 shown in FIG. 2 is formed with a lead-out terminal 601. As shown by FIG. 6, the lead-out terminal 601 is formed in a shape of "L" along portions of the periphery of the light receiving matrix 111 where the peripheral drive circuits 112 are not connected. Further, the lead-out terminal 601 is provided with a portion extended to outside of the light receiving region 110 and is connected to a terminal formed in the outside lead-out terminal portion 130 at the portion.

Further, a terminal 602 for fixing potential of the electrode layer 308 formed later at outside of the display matrix 121 is formed in the display region 120.

After having been subjected to CMOS process mentioned above, the light receiving matrix 111 and the display matrix 121 both using polycrystal silicon TFTs and CMOS-TFTs arranged to the drive circuits 112, 122 are simultaneously completed. Although in this case, the TFTs are of a planer type of top gate, they may be of a bottom gate type of inverse stagger or the like. In this case, the order of forming the activation layers 201, 301, 401 and 402 and the select lines 202 and 302 and the gate electrode 403 may be reversed and the gate insulating film 520 may be formed after forming the select lines 202 and 302 and the gate electrode 403. Further, LDD (Lightly Doped Drain) regions or offset regions may be provided.

Next, as shown by FIG. 3C, a second interlayer insulating film 540 for separating to insulate the light receiving unit TFT from the light receiving portion. A resin film canceling recesses and protrusions of the lower layer and providing a flat surface is preferable for the second interlayer insulating film 540. Polyimide, polyamide, polyimideamide or acrylic resin can be used for the resin film. Further, the surface layer of the second interlayer insulating film 540 may be constituted by a resin film to provide a flat surface and the lower layer may be of a single layer or multi layers of inorganic insulating materials of silicon oxide, silicon nitride, silicon oxynitride or the like. According to the embodiment, a polyimide film is formed by a thickness of 1.5 μm as the second interlayer insulating film 540.

Next, after respectively forming contact holes reaching the source electrode 207, the drain electrode 307 and the terminals 601 and 602 in the second interlayer insulating film 540, a conductive film 11 comprising Ti, Cr, Mo, Al or the like constituting the lower electrode of the light receiving unit and the electrode layer of the display matrix, are formed. According to the embodiment, the titanium film 11 having a thickness of 200 nm is formed as the conductive film.

Next, an amorphous silicon film 12 of n-type for coupling the photoelectric conversion layer and the lower electrode of the light receiving unit in ohmic coupling is formed over the entire face of the substrate by a thickness of 30 through 50 nm, in this case, 30 nm. A resist mask 13 for patterning the titanium film 11 and the silicon film 12 is formed.

By using the resist mask 13, as shown by FIG. 4A, the silicon film 12 and the titanium film 11 are successively patterned. In this case, a dry etching process is used. As an etching gas of the silicon film 12, $O_2$ gas mixed with $CF_4$ by 1 through 10% is used. In this embodiment, the concentration of $CF_4$ is set to 5%. Further, as an etching gas of the titanium film 11, a chlorine-base gas mixed with $Cl_2/BCl_3/SiCl_4$ is used. Further, the titanium film 11 is formed on the insulating film 540 comprising resin and accordingly, it is necessary to select an etching gas or an etchant of the titanium film 11 which does not convert the resin.

By patterning the titanium film 11, as shown by FIG. 4A, the light receiving matrix 111 is formed with the lower electrode 208 of the light receiving unit and the electrode layer 308 of the display matrix 121, an electrode 309 for connecting with the pixel electrode and the terminal 603 of the terminal unit 113, are formed. Layers 209, 310, 311 and 604 which comprise the n-type silicon film 12 and are patterned in shapes substantially the same as that of the titanium film 11, are formed on the electrodes 208, 308, 309 and 603 comprising titanium.

The Layers 310, 311 and 604 other than those in the light receiving matrix may not be formed since they are not provided with substantial function. In this case, patterning may be separately carried out in respect of the titanium film 11 and the silicon film 12. However, the step can be simplified by simultaneously carrying out patterning of the titanium film 11 and the silicon film 12.

Further, as the layer 209 at the light receiving unit, microcrystal silicon can be used in place of amorphous silicon. Further, silicon nitride, silicon oxide or silicon carbide added with an n-type impurity such as phosphorus or the like can be used.

Figure 7A:
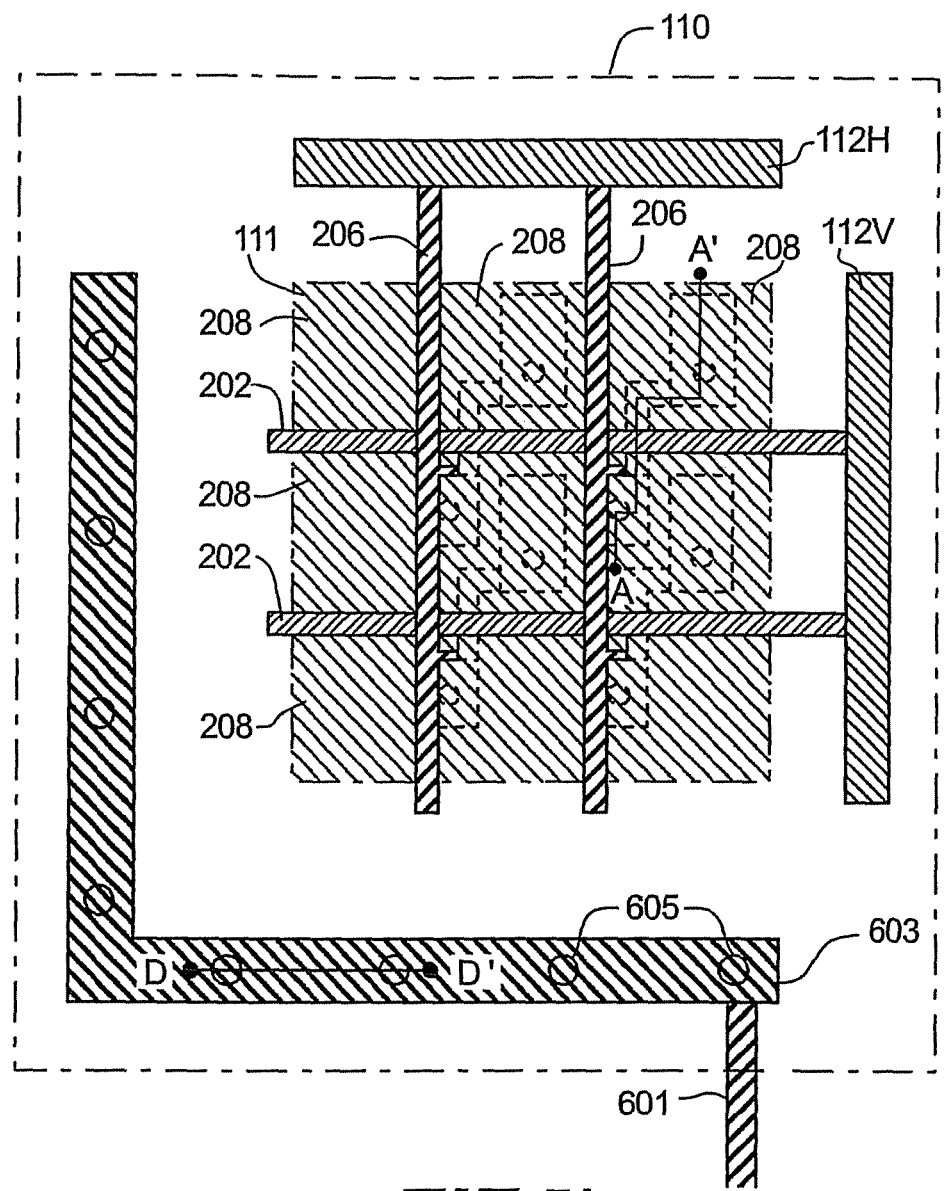
FIGS. 7A and 7B are a front view and a sectional view for explaining fabrication steps of the light receiving matrix according to Embodiment 1.
Figure 11:
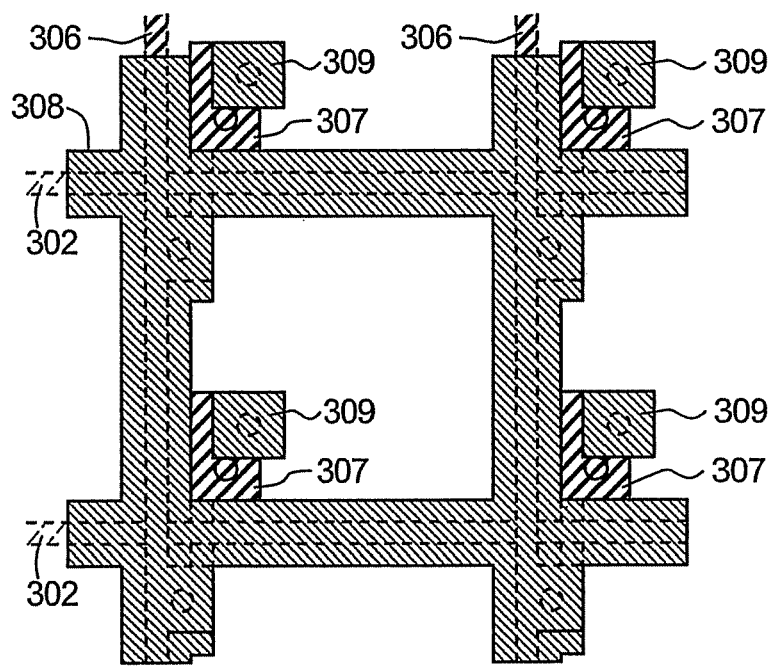
FIG. 11 is a front view for explaining fabrication steps of the display matrix according to Embodiment 1.

FIG. 7A and FIG. 11 respectively show top views of the light receiving region 110 and the display matrix 120. Further, in FIG. 7A and FIG. 11, the layers 209, 310, 311 and 604 are omitted.

As shown by FIG. 7A, the lower electrodes 208 are formed to separate from each other at the respective pixels in a lattice formed by the select lines 202 and the signal lines 206. Further, the terminal 603 connected to the lead-out terminal 601 is formed in the terminal unit 113. The terminal 603 is formed in a shape of "L" along portions of the periphery of the light receiving matrix which are not connected to the peripheral drive circuits 112 similar to the terminal 601. The sectional view taken along a line A-A' of FIG. 7A is illustrated by the light receiving matrix 111 of FIG. 4A.

Figure 7B:
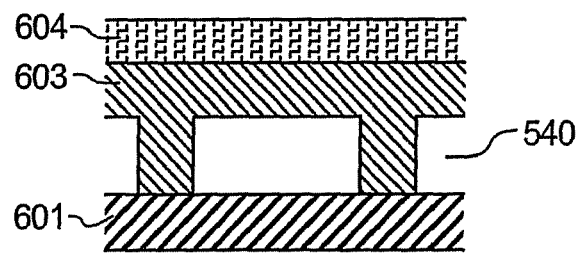

As shown by FIG. 7B, the terminal 601 and the terminal 603 are connected between upper and lower positions thereof via the plurality of contact holes formed in the insulating film 540. The smaller the contact, the more alleviated is antenna effect and accordingly, the terminals 601 and 603 are connected by the plurality of contact holes 605. Further, a sectional view taken along a line D-D' of FIG. 7A corresponds to FIG. 7B. The pitch of the contact holes 605 poses no problem in equalizing potential of the upper electrode when it is at a degree the same as that of the pitch of the light receiving pixels.

Meanwhile, as shown by FIG. 11, the display matrix 121 is integrally formed with the electrode layer 308 in a lattice shape to cover the activation layer 301 except portions in contact with the select lines 302, the signal lines 306 and the electrodes 307. The electrode layer 308 prevents light from being incident on the light receiving unit and prevents light from leaking from other than the effective display region. Further, the electrode layer 308 is connected to the lead-out wiring 602 at outside of the display matrix 121. Potential of the lead-out wiring 602 is fixed to constant potential and therefore, potential of the electrode layer 308 is also fixed to constant potential. Thereby, potential of the pixel electrode at a layer above the electrode layer 308 can be prevented from varying by a variation in potential of the select lines 302 and the signal lines 306 at a layer below the electrode layer 308.

Next, as shown by FIG. 4A, after patterning the titanium film 11 and the silicon film, an intrinsic or a substantially intrinsic amorphous silicon film 14 is formed by a film thickness of 1 through 2 μm, in this case, 1.5 μm, in continuation thereto, a p-type amorphous silicon film 15 including boron is formed in a thickness of 30 through 100 nm, in this case, a thickness of 50 nm. Further, a transparent conductive film constituting the upper electrode of the light receiving unit, in this case, an ITO (Indium Tin Oxide) film 16 is formed in a thickness of 120 nm. Further, a resist mask 17 for patterning these films 14 through 16 are formed.

Further, a state in which the amorphous silicon film 14 is substantially intrinsic designates a state in which a p-type impurity of boron or the like is added by about $5 \times 10^{16}$ through $1 \times 10^{19}$ cm$^{-3}$ and the Fermi level is disposed at the center of the band gap. This does not mean that in forming the amorphous silicon, the Fermi level is not necessarily disposed at the center of the band gap and the Fermi level is deviated slightly in a direction constituting n-type. Therefore, as described above, by adding the p-type impurity, the Fermi level can be disposed at the center of the band gap. In this case, although the impurity is added, the state where the Fermi level is disposed at the center of the band gap is referred to as a substantially intrinsic state.

Further, amorphous silicon germanium can be used in place of the intrinsic or the substantially intrinsic amorphous silicon film 14. Further, microcrystal silicon can be used in place of the p-type amorphous silicon film 15.

Next, by using the resist mask 17, the ITO film 16, the p-type silicon films 15 and the intrinsic or the substantially intrinsic silicon film 14 are successively patterned and as shown by FIG. 4B, the upper electrode 212, the p layer 211 and the i layer 210 are respectively formed. In patterning the ITO film 16, the silicon films 15 and 14, RIE (Reactive Ion Etching) using an etching gas mixed with $CF_4/SF_6/O_2$ is used. Further, after patterning the ITO film 16, by using a gas etching only the silicon film, the silicon films 15 and 14 can be etched with the upper electrode 212 as a mask and accordingly, the resist mask 17 can be dispensed with. However, by leaving the resist mask 17 in etching the silicon films 15 and 14, the upper electrode 212 can be prevented from being converted by the RIE etching.

According to the embodiment, patterning steps of the silicon films 15 and 14 and the ITO film 16 are carried out continuously, that is, no patterning step is carried out during formation of the silicon film 15 and 14 prior to formation of the ITO film by which lowering the aperture rate caused by a shift in patterns of the upper electrode 212 and the photoelectric conversion layer 210 can be avoided.

Further, the upper electrode 212, the p layer 211 and the i layer 210 are formed not only in the light receiving matrix 111 but also on the side of the terminal unit 113 by projecting them. This is for connecting the upper electrode 212 to the electrode 604 at later steps without lowering the aperture ratio and considering fabrication margin or reliability of the light receiving unit, a width projected to the side of the terminal unit 113 may be about 2 through 10 times as large as the pitch of the light receiving pixels.

Further, in view of the reliability of the light receiving unit, at the i layer 210, a boundary portion of the light receiving matrix 111 may be insulated to prevent photo carriers generated at a portion of the i layer 210 at outside of the light receiving matrix 111 from leaking into the light receiving matrix 111. As one method of insulation, there is a method in which a groove portion is formed in the i layer 210 along the boundary portion of the light receiving matrix 111 and an insulating substance is embedded into the groove portion. The groove portion may be formed to completely divide the i layer 210. Further, when the boundary portion is insulated as mentioned above, the steps of patterning the silicon films 14 and 15 and the step of patterning the ITO film 16 need to carry out separately.

Next, after removing the resist mask 17, as shown by FIG. 1, the third interlayer insulating film 550 constituting the matrix of the pixel electrode 312 of the display matrix 121 is formed over the entire face of the substrate 500. The insulating film 550 functions also as a passivation film of the light receiving matrix 111. As an insulating film constituting the third interlayer insulating film 550, a resin film of polyimide, polyamide, polyimideamide, acrylic resin or the like is formed to provide a flat surface. In this embodiment, a polyimide film is formed with a film thickness at the light receiving matrix 111 of 0.3 through 1 μm, in this case, 0.5 μm.

Next, contact holes reaching the upper electrode 212, the electrode 309 and the terminal 603 are formed in the interlayer insulating film 550. In this case, an RIE etching process using $O_2$ gas mixed with 1 through 10% of $CF_4$ as an etching gas is used. Although etching can be carried out only with $O_2$ gas since the interlayer insulating film 550 comprises resin, by mixing with $CF_4$, the layers 310 and 604 comprising n-type silicon films on the electrode 309 and the terminal 603 are also etched.

Figure 8A:
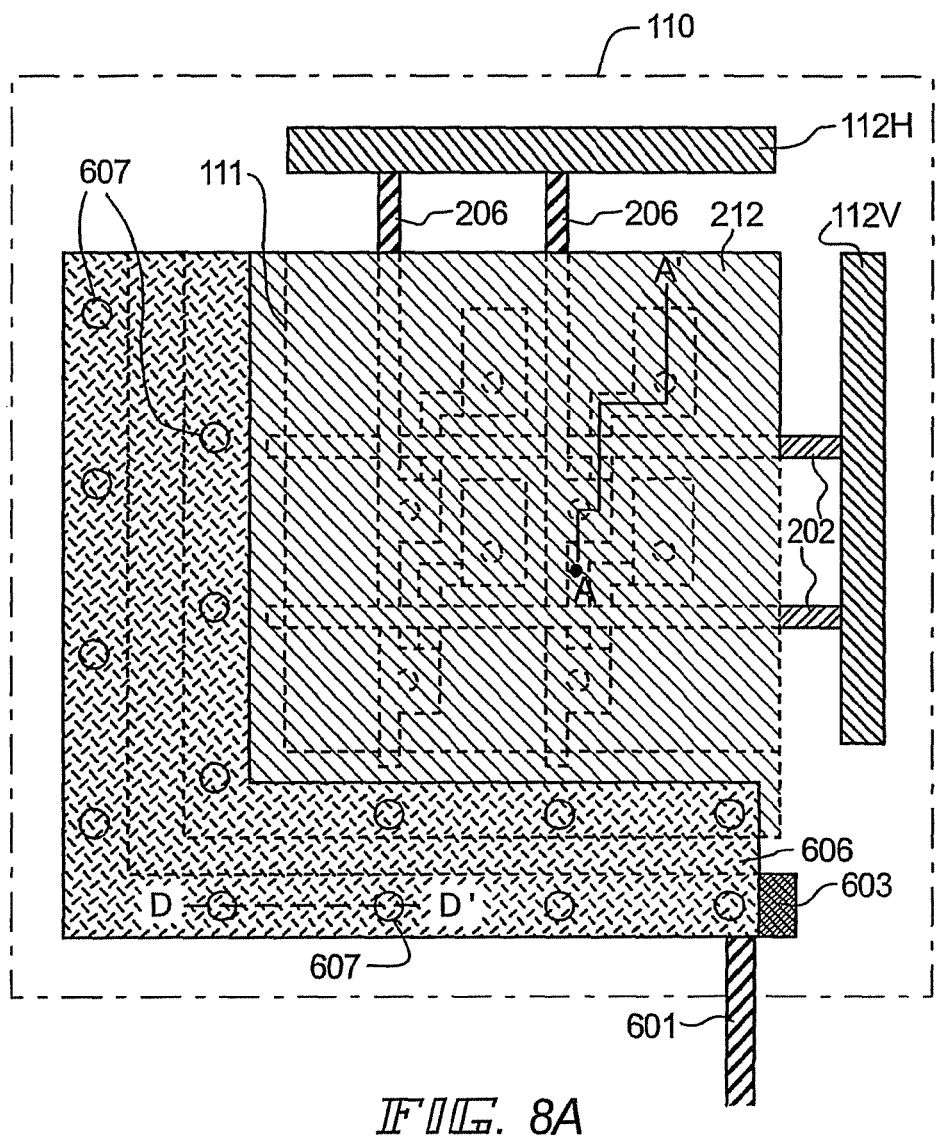
FIGS. 8A and 8B are a front view and a sectional view for explaining fabrication steps of the light receiving matrix according to Embodiment 1.
Figure 12:
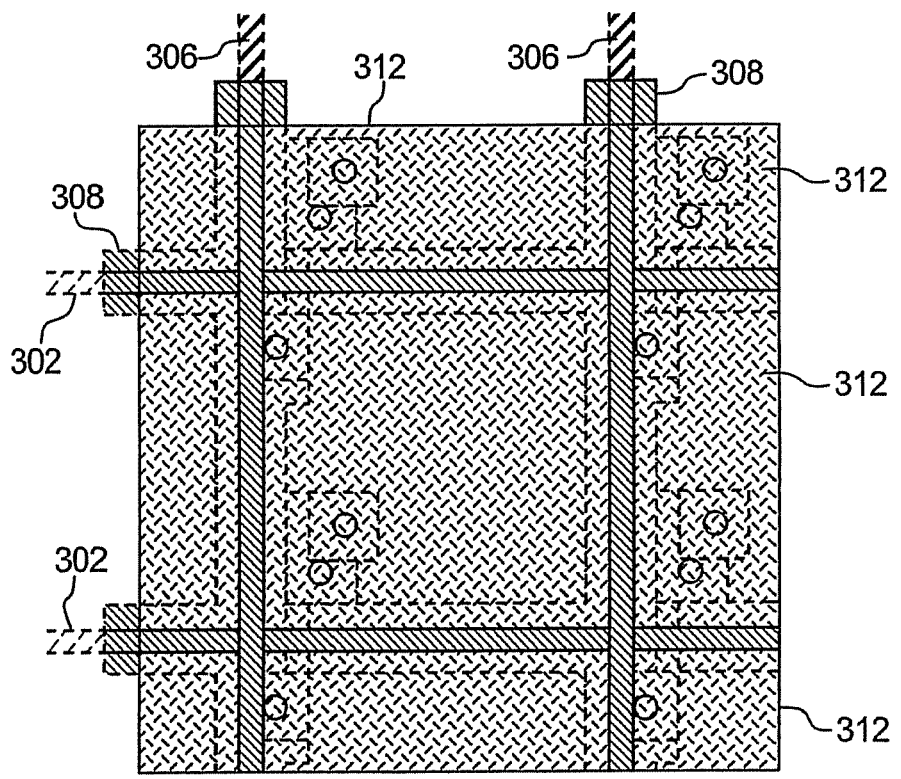
FIG. 12 is a front view for explaining fabrication steps of the display matrix according to Embodiment 1.

After opening the contact holes, an ITO film having a thickness of 100 through 300 nm, in this case, 120 nm is formed by a sputtering process and is patterned by using an etching gas mixed with $CF_4/SF_6/O_2$ by which the pixel electrode 312 connected to the electrode 309 and the lead-out terminal 606 for connecting the upper electrode 212 to the terminal 603 are formed. FIG. 8A and FIG. 12 show respectively top views of the light receiving matrix 111 and the display matrix 121 under the state.

As shown by FIG. 8A, similar to the terminal 603, the lead-out terminal 606 is formed in a shape of "L" to surround portions of the periphery of the light receiving matrix 111 to which the drive circuits 112 are not connected. Further, the terminal 606 is connected to the upper electrode 212 at outside of the light receiving matrix 111 and is connected to the terminal 603 at the terminal unit 113. According to the structure, by fixing the lead-out terminal 601 to constant potential, potential of the upper electrode 212 is fixed to constant potential via the terminals 606 and 603. For example, to fix the terminal 601 at constant potential, the terminal 601 is connected to an outside lead-out terminal formed at the lead-out terminal unit 113 shown by FIG. 1. In this case, the outside lead-out terminal can be formed by a conductive film the same as those of the signal lines 206 and 306 and the outside lead-out terminal and the lead-out terminal 601 can integrally be formed.

Figure 8B:
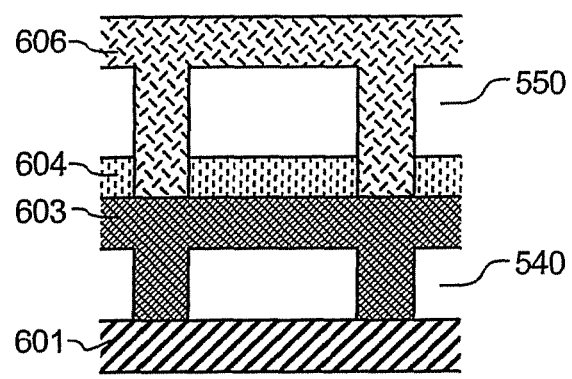

Further, in order to render a total of the upper electrode 212 constant potential, contact holes 607 for connecting the terminal 606 may be provided with a pitch substantially the same as that of the light receiving pixels. Further, FIG. 8B shows a sectional view taken along a line D-D' of FIG. 8A. Further, a sectional view taken along a line A-A' of FIG. 8A is illustrated by the light receiving matrix 111 of FIG. 1.

In this case, the terminals 601, 603 and 606 are formed to surround portions of the periphery of the light receiving matrix 111 to which the drive circuits 121 are not connected and accordingly, as is apparent from the constitution of section in FIG. 1, a side face of the light receiving unit (photodiode) is surrounded by the terminal 601, the terminals 603 and 606. In this case, potential of the terminal 601 and the terminals 603 and 606 are fixed constant and accordingly, they can function as a shield against the light receiving unit. Therefore, even when the display matrix 121 and the light receiving matrix 111 are provided on the same substrate, the reliability of the light receiving unit can be maintained.

Further, other ends of the select lines 202 and the signal lines 206 which are opposed to ends thereof connected to the peripheral circuits 112H and 112V can also be protected electrically by the terminals 601, 603 and 606 and accordingly, electrostatic breakdown of TFTs arranged at the light receiving matrix 111 can be restrained.

On the other hand, according to the display matrix 121, as shown by FIG. 12, the pixel electrodes 312 are formed such that they are electrically separated from each other at the respective display pixels and peripheries thereof overlap the electrode layer 308. By this structure, auxiliary capacity with the insulating film 550 as a dielectric body and the electrode layer 308, the pixel electrode 312 as opposed electrodes, can be formed. Incidentally, in FIG. 12, the layer 309 on the electrode layer 308 is omitted.

The embodiment is constituted by a laminated layer type forming the light receiving unit (photodiode) on TFTs after fabricating the light receiving matrix 111 by TFTs and accordingly, even when the light receiving unit is formed by an amorphous silicon film as in the conventional case, light receiving TFT can be formed by polycrystal silicon. Accordingly, an image sensor having excellent conversion efficiency and capable of responding at high speed can be fabricated on an insulating substrate such as a glass substrate or the like.

Further, by constituting the image sensor by a laminated layer structure, the consistency with steps of fabricating a liquid crystal panel which is conventionally constituted by polycrystal silicon TFT, is established. Accordingly, integration can be carried out on the same substrate without deteriorating the respective characteristics of the image sensor and the liquid crystal panel.

Although according to the embodiment, the light receiving pixels are arranged two-dimensionally on the light receiving matrix 111, a line sensor in which light receiving pixels are arranged one-dimensionally may be constituted. Further, when format of light receiving pixels are made to be the same as format of a display unit, the light receiving pixels and the display pixels correspond to each other in one-to-one relationship and accordingly, signal processing for displaying an image detected by the light receiving matrix 111 on the display matrix 121 can be simplified and accelerated. Even in the case of a line sensor, a number of light receiving pixels may be the same as a number of display pixels in a row direction or a column direction.

When the pixel formats are made to coincide with each other, in the case where, for example, format of the display matrix 121 is 640×480 (VGA standard), when one receiving pixel pitch is set to about 10 μm, an occupied area of the light receiving matrix 111 is about 6.4 mm×4.8 mm and integration thereof to a liquid crystal panel is feasible.

Although according to the embodiment, the light receiving unit is constituted by a photodiode of a resistor type and accordingly, the n-type silicon layer 209 and the p-type silicon layer 211 for coupling the lower electrode 208 and the upper electrode in ohmic coupling are provided, for example, in the case of constituting a Schottky type, the layer 209 and the layer 211 may be omitted.

Although according to the embodiment, a transmission type liquid crystal display panel is constituted, the pixel electrode 312 can be rendered a reflection type electrode having a mirror surface to constitute a liquid crystal panel of a direct viewing type.

Although the embodiment is of a passive type provided with one TFT functioning as a switching element in the light receiving matrix 111 as a signal reading circuit connected to the light receiving unit (photodiode), an active type having an amplifying function can be constituted by a plurality of TFTs.

Embodiment 2

The embodiment is a modified example of the terminal unit 113 in the light receiving region 111. An explanation will be given of the embodiment in reference to FIG. 15.

According to the embodiment, the terminal 601 comprising a starting film the same as that of the signal line 306 is omitted. In this case, a wiring 701 at the lowest layer is constituted by a wiring comprising a starting film the same as that of the electrode layer 308. The shape of the wiring 701 is made similar to that of the terminal 601 of the first embodiment and may be extended to outside of the light receiving matrix 111 to connect to a terminal formed at the outside lead-out terminal unit 130.

Embodiment 3

The embodiment is a modified example of the terminal unit 113 of the light receiving region 111. An explanation will be given of the embodiment in reference to FIG. 16.

According to the embodiment, the terminal 601, 603 and the layer 604 are omitted. In this case, a wiring 801 arranged at the terminal unit 113 is constituted by only a wiring comprising a starting film the same as that of the pixel electrode 312. The shape of the wiring 801 is similar to the terminal 601 of Embodiment 1 and the wiring 801 may be extended to outside of the light receiving matrix 111 to connect to a terminal formed at the outside lead-out terminal unit 130.

Embodiment 4

The embodiment is a modified example of the terminal unit 113 of the light receiving region 111. Although according to Embodiment 1, the terminal 601 at the lowest layer of the terminal unit and the signal line 306 are formed by the same starting film, they can be constituted by a starting film the same as that of the select line 302.

Embodiment 5

The embodiment is a modified example of the terminal unit 113 of the light receiving region 111. In Embodiment 1, the terminal 603 comprising a starting material the same as that of the electrode layer 308 is omitted and the terminal 606 and the terminal 601 are connected to each other directly. Further, in this case, as described in Embodiment 4, the terminal 601 can be constituted by a starting film the same as that of the select line 302.

Embodiment 6

In this embodiment, an explanation will be given of a product to which a liquid crystal panel of an image sensor integrated type is applied. FIGS. 17A, 17B and 17C show schematic outlook views of electronic devices according to the embodiment.

The liquid crystal panel according to Embodiment 1 is integrally installed with the light receiving region having picture taking function and the display region and accordingly, the liquid crystal panel is appropriate to a display unit having communication function of a TV conference system, a TV telephone, a terminal for internet, a personal computer or the like. For example, while looking at an image transmitted from a terminal of a dialogue partner by a display unit, an image of its own is taken by a light receiving matrix and the image can be transmitted to the terminal of the dialogue partner and accordingly, bi-directional communication of dynamic image can be carried out.

Further, a notebook type personal computer 2000 having a liquid crystal panel is illustrated in FIG. 17A as one of the electronic devices. Numeral 2001 designates a liquid crystal panel and numeral 2002 designates an image sensor unit.

Further, as other electronic device, in FIG. 17B, a television telephone 2010 is shown. Numeral 2011 designates a liquid crystal panel and numeral 2012 designates an image sensor unit. A user can talk with a dialogue partner while looking at an image thereof by the liquid crystal panel 2011 and while taking an image of its own by the image sensor unit 2012.

Further, FIG. 17C shows a portable type information terminal device 2020 of a pen input type. Numeral 2021 designates a liquid crystal panel and numeral 2022 designates an area sensor unit. Letter/graphic information of a name card or the like is inputted by the area sensor 2022 and the information can be displayed on the liquid crystal panel 2021 or preserved in the portable type information terminal device.

According to the present invention, the liquid crystal panel and the sensor unit are installed on the same substrate and accordingly, the device can be small-sized and light-weighted. Further, driving of the sensor unit can be made common to driving of the liquid crystal panel and accordingly, power conservation can be achieved. Therefore, as shown by FIGS. 17A, 17B and 17C, the present invention is preferably used in an electronic device of a battery drive type.

According to the embodiments, the display matrix and the light receiving matrix are formed on the same substrate and accordingly, a film forming process and a patterning process can be made common in the respective matrices by which the fabrication cost can be restrained low.

Further, according to the embodiment, the lead-out terminal for fixing potential of the upper electrode of the light receiving unit is not integrally formed with the upper electrode by which patternings of the upper electrode and the photoelectric conversion layer of the light receiving unit can be carried out continuously and lowering the aperture ratio caused by shift of masks can be prevented. Further, by forming the lead-out terminal by a starting film the same as that of the pixel electrode of the display matrix, the process can be simplified.

What is claimed is:

1. An image sensor comprising:
a thin film transistor in a pixel of a plurality of pixels;
an insulating layer over the thin film transistor;
a plurality of first electrodes over the insulating layer;
a photoelectric conversion layer including a semiconductor film over the plurality of first electrodes, the semiconductor film including amorphous silicon; and
a second electrode over the photoelectric conversion layer,
wherein the plurality of first electrodes are separated from each other at respective of the pixels,
wherein the second electrode is common to the pixels, and
wherein one of the plurality of first electrodes is electrically connected to the thin film transistor.

2. The image sensor according to claim 1, wherein the photoelectric conversion layer is patterned with the second electrode as a mask.

3. An image sensor comprising:
a thin film transistor in a pixel of a plurality of pixels;
a first insulating layer over the thin film transistor;
a plurality of first electrodes over the first insulating layer;
a photoelectric conversion layer including a semiconductor film over the plurality of first electrodes, the semiconductor film including amorphous silicon;
a second electrode over the photoelectric conversion layer; and
a second insulating layer over the second electrode;
a lead-out terminal over the second insulating layer,
wherein the plurality of first electrodes are separated from each other at respective of the pixels,
wherein the second electrode is common to the pixels, and
wherein one of the plurality of first electrodes is electrically connected to the thin film transistor.

4. The image sensor according to claim 3, wherein the photoelectric conversion layer is patterned with the second electrode as a mask.

5. An image sensor comprising:
a thin film transistor in a pixel of a plurality of pixels;
an insulating layer over the thin film transistor;
a plurality of first electrodes over the insulating layer;
a photoelectric conversion layer including an n-type silicon film over the plurality of first electrodes and a semiconductor film including amorphous silicon over the n-type silicon film;
a p-type silicon film over the photoelectric conversion layer; and
a second electrode over the photoelectric conversion layer,
wherein the plurality of first electrodes are separated from each other at respective of the pixels,
wherein the second electrode is common to the pixels, and
wherein one of the plurality of first electrodes is electrically connected to the thin film transistor.

6. The image sensor according to claim 5, wherein the photoelectric conversion layer is patterned with the second electrode as a mask.

7. An image sensor comprising:
a thin film transistor in a pixel of a plurality of pixels;
a first insulating layer over the thin film transistor;
a plurality of first electrodes over the first insulating layer;
a photoelectric conversion layer including an n-type silicon film over the plurality of first electrodes and a semiconductor film including amorphous silicon over the n-type silicon film;
a p-type silicon film over the photoelectric conversion layer; and
a second electrode over the photoelectric conversion layer; and
a second insulating layer over the second electrode;
a lead-out terminal over the second insulating layer,
wherein the plurality of first electrodes are separated from each other at respective of the pixels,
wherein the second electrode is common to the pixels, and
wherein one of the plurality of first electrodes is electrically connected to the thin film transistor.

8. The image sensor according to claim 7, wherein the photoelectric conversion layer is patterned with the second electrode as a mask.

* * * * *